United States Patent

Hasegawa et al.

Patent Number: 5,750,294
Date of Patent: May 12, 1998

[54] BEST FOCUS DETERMINING METHOD

[75] Inventors: Masanobu Hasegawa, Utsunomiya; Minoru Yoshii, Tokyo; Seiji Takeuchi, Utsunomiya, all of Japan

[73] Assignee: Canon Kabushiki Kaisha, Tokyo, Japan

[21] Appl. No.: 685,464

[22] Filed: Jul. 24, 1996

[30] Foreign Application Priority Data

Jul. 26, 1995 [JP] Japan .................. 7-211230

[51] Int. Cl.⁶ ............................................. G03F 9/00
[52] U.S. Cl. ........................... 430/22; 430/30; 355/63
[58] Field of Search ..................... 430/5, 22, 30; 355/61, 63

[56] References Cited

U.S. PATENT DOCUMENTS

| | | | |
|---|---|---|---|
| 5,044,750 | 9/1991 | Shamble | 430/30 |
| 5,578,401 | 11/1996 | Hwang | 430/5 |
| 5,610,718 | 3/1997 | Sentoku et al. | 356/363 |
| 5,656,403 | 8/1997 | Shieh | 430/22 |

*Primary Examiner*—Christopher G. Young
*Attorney, Agent, or Firm*—Fitzpatrick, Cella, Harper, & Scinto

[57] ABSTRACT

Disclosed is a method of determining a best focus position or best exposure amount of a projection lens in an arrangement wherein a reticle is placed on a plane perpendicular to an optical axis of the projection lens, wherein a pattern having periodicity in a predetermined direction is provided on a surface of the reticle, wherein the pattern is transferred to a photosensitive substrate by the projection lens to form a printed pattern thereon. The method includes providing the pattern by using a plurality of zigzag openings of a constant line width, extending in a direction perpendicular to the predetermined direction and being arrayed with a constant periodicity along that direction, transferring the pattern to the photosensitive substrate sequentially with different focus positions to form plural printed patterns thereon, imaging the printed patterns upon an image pickup surface of photoelectrically converting means; calculating, from an imagewise signal produced by the photoelectrically converting means, information related to one frequency component of zigzag lines, constituting an outline of an image of the zigzag opening, and determining the best focus position on the basis of the information.

8 Claims, 8 Drawing Sheets

EDGE PROFILE BY BEST FOCUS

EDGE PROFILE BY DEFOCUS

EDGE PROFILE BY BEST FOCUS

EDGE PROFILE BY DEFOCUS

BEST FOCUS DETERMINING METHOD

FIELD OF THE INVENTION AND RELATED ART

This invention relates to a best focus determining method and an exposure method using the same. The present invention is particularly suitably applicable to an exposure apparatus used in a lithographic process for manufacture of LSIs.

Because of further increases in density of a circuit pattern of LSI and further reduction in line width of a pattern to be transferred, into a submicron order, in exposure apparatuses to be used in a lithographic process for LSI manufacture it is very important to accurately set the best focus position and best exposure amount, namely, best exposure conditions, to keep the resolving power of a projection lens constant.

Conventionally, trial printing is executed to this end. More specifically, every time exposure of one shot is completed, the exposure condition, namely, at least one of focus position and exposure amount (shutter time) is changed and, after exposure and development of a photosensitive substrate, the line width of a straight pattern is measured by using an optical microscope or a line width measuring device. On the basis of the measurement, the best focus position and best exposure amount, namely, the best exposure conditions, are determined.

In a step-and-repeat type exposure apparatus, for example, with regard to a lateral direction of arrayed shot regions on a wafer, exposures of them are performed while sequentially changing the exposure amount (shutter time) by a constant amount but keeping the focus value constant. With regard to a longitudinal direction of the arrayed shot regions, exposures of them are performed while sequentially changing the focus value by a constant amount but keeping the exposure amount constant.

After a development process, the line width of a line-and-space resist pattern formed in each shot region is measured through a SEM measurement process using a scanning electron microscope, for example, and the best focal point position (best focus) and best exposure amount of the exposure apparatus are determined.

SUMMARY OF THE INVENTION

In the procedure described above, since determination of the best focus and best exposure amount necessitates use of a SEM after development of an exposure substrate for measurement of the line width of a resist pattern, it takes much time to obtain the result. Also, the measuring device required is very expensive.

It is an object of the present invention to provide a best focus determination method and/or an exposure method using the same, by which a best focus position and/or best exposure amount suited to the type of a resist used can be determined in a short time and automatically, with a good precision and without using an expensive scanning electron microscope.

In accordance with an aspect of the present invention, there is provided a method of determining a best focus position of a projection lens in an arrangement wherein a reticle is placed on a plane perpendicular to an optical axis of the projection lens, wherein a pattern having periodicity in a predetermined direction is provided on a surface of the reticle, wherein the pattern is transferred to a photosensitive substrate by the projection lens to form a printed pattern thereon, wherein the pattern formation is repeated with different focus positions, and wherein the best focus position of the projection lens is determined on the basis of different printed patterns transferred to the photosensitive substrate, said method comprising the steps of: providing the pattern by using a plurality of zigzag openings of a constant line width, extending in a direction perpendicular to the predetermined direction and being arrayed with a constant periodicity along that direction; transferring the pattern to the photosensitive substrate sequentially with different focus positions to form plural printed patterns thereon; imaging the printed patterns upon an image pickup surface of photoelectrically converting means; calculating, from an imagewise signal produced by the photoelectrically converting means, information related to one frequency component of zigzag lines, constituting an outline of an image of the zigzag opening; and determining the best focus position on the basis of the information.

Said calculation of the information related to the one frequency component of the zigzag line may comprise (i) sequentially producing one-dimensional electric signal trains along the direction by using the photoelectrically converting means, (ii) executing Fourier transformation to the one-dimensional electric signal trains to calculate a phase of a spatial frequency component corresponding to the periodicity of the pattern, and (iii) detecting a maximum value and a minimum value of the phase.

The photosensitive substrate may comprise a wafer having a resist coating.

The printed pattern may comprise a resist pattern defined after a development process.

The printed pattern may comprise a latent image formed in a resist layer before a development process.

In accordance with another aspect of the present invention, there is provided a method of determining a best focus position of a projection lens in an arrangement wherein a reticle is placed on a plane perpendicular to an optical axis of the projection lens, wherein a pattern having periodicity in a predetermined direction is provided on a surface of the reticle, wherein the pattern is transferred to a photosensitive substrate by the projection lens to form a printed pattern thereon, wherein the pattern formation is repeated with different focus positions, and wherein the best focus position of the projection lens is determined on the basis of different printed patterns transferred to the photosensitive substrate, said method comprising the steps of: providing the pattern by using a plurality of zigzag openings of a constant line width, extending in a direction perpendicular to the predetermined direction and being arrayed with a constant periodicity along that direction; imaging the printed patterns upon an image pickup surface of photoelectrically converting means; calculating, from an imagewise signal produced by the photoelectrically converting means, information related to one frequency component of zigzag lines, constituting an outline of an image of the zigzag opening; and determining the best focus position on the basis of the information.

In accordance with a further aspect of the present invention, there is provided a method of determining a best exposure amount, comprising the steps of: placing a reticle on a plane perpendicular to an optical axis of a projection lens; providing, on a surface of the reticle, a pattern having zigzag openings of a constant line width, extending in a direction perpendicular to a predetermined direction and being arrayed with a constant periodicity along that direction; sequentially transferring the pattern to a photosensitive substrate with different focus positions of the projection lens and with different exposure amounts to form printed patterns thereon; imaging the printed patterns upon an image pickup surface of photoelectrically converting means; sequentially providing, through the photoelectrically converting means, one-dimensional electric signal trains along the direction; executing Fourier transformation to the one-dimensional electric signal trains to calculate phase information and intensity information of a spatial frequency component; determining the best focus position of the projection lens on the basis of the phase information of the spatial frequency component corresponding to the periodicity of the pattern; and determining the best exposure amount on the basis of a characteristic of a spatial frequency component produced by Fourier transformation of printed patterns formed at the determined best focus position and with different exposure amounts.

In accordance with a yet further aspect of the present invention, there is provided a method of determining a best focus position of a projection lens, comprising the steps of: providing on a reticle a pattern having a plurality of triangular patterns arrayed periodically in one direction and including repetitions of a unit pattern of triangular shape in a one-dimensional direction; projecting, through a projection lens, the pattern of the reticle onto a photosensitive substrate while sequentially changing a position of the photosensitive substrate in an optical axis direction; and determining the best focus position of the projection lens on the basis of imagewise information of the pattern in one direction of the photosensitive substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A and 5B are fragmentary and enlarged views of resist patterns printed on a wafer, wherein FIG. 5A illustrates the best focus state and FIG. 5B illustrates a defocus state.

FIGS. 8A and 8B are fragmentary and enlarged views of resist patterns imaged upon an image pickup surface of the resist pattern measuring system, wherein FIG. 8A illustrates the best focus state and FIG. 8B illustrates a defocus state, and wherein detection picture element lines m and n schematically depict time series production of electric signal trains Sy(x) each shown a light intensity distribution.

DESCRIPTION OF THE PREFERRED EMBODIMENTS

Figure 1:
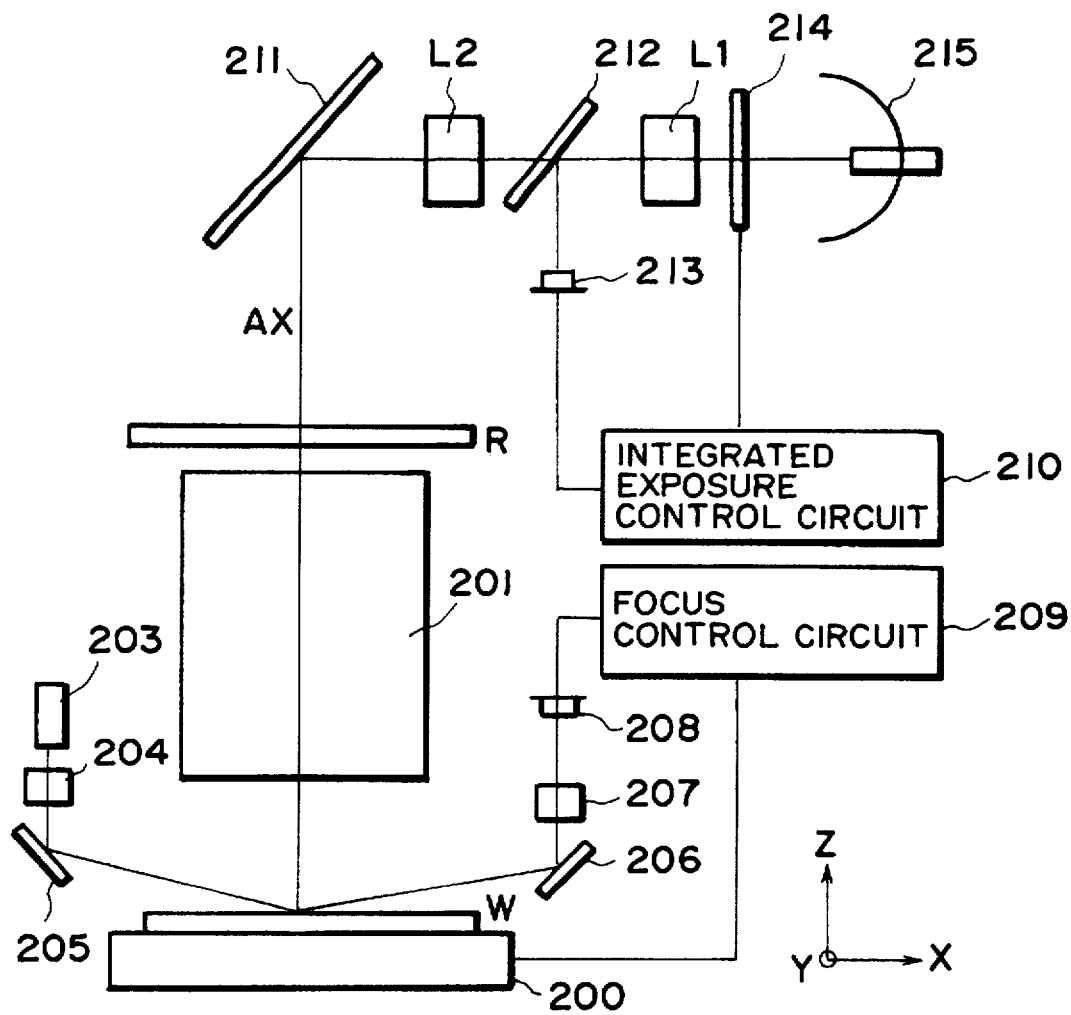
FIG. 1 is a schematic view of a main portion of an exposure apparatus to which the present invention is applicable.
Figure 2:
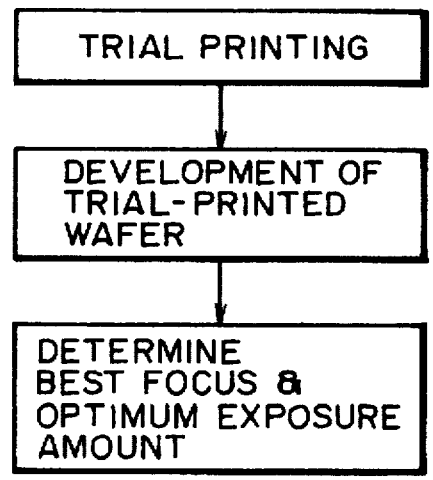
FIG. 2 is flow chart for explaining processes of determining a best focus and best exposure amount.

FIG. 1 is a schematic view of a main portion of an exposure apparatus in which the exposure condition, that is, best focus and best exposure amount, is to be determined. FIG. 2 is a flow chart of operations for best focus determination and exposure condition determination using the same. As shown in FIG. 2, the determination process comprise three steps.

At the first step, trial printing of a measurement pattern through the exposure apparatus is performed. At the second step, a wafer having been processed by trial printing is developed. At the third step, best focus and optimum exposure amount are determined on the basis of a resist pattern printed on the wafer.

(1) Trial Printing

FIG. 1 is a schematic view of a main portion of an exposure apparatus to which the present invention is applied. The exposure apparatus comprises focus position controlling means and exposure controlling means. Denoted in the drawing at 215 is an exposure light source such as Hg lamp, for example. Denoted at 214 is an openable/closable shutter, and denoted at 212 is a half mirror. Denoted at 211 is a mirror, and denoted at L1 and L2 are illumination optical systems.

Denoted at R is a reticle on which a circuit pattern and a measurement pattern for trial printing are formed. Denoted at W is a wafer (photosensitive substrate) having a coating of resist thereon. Denoted at 201 is a projection lens (reduction projection lens) for projecting and transferring the circuit pattern, for example, of the reticle R onto the wafer W in a reduced scale. It has an optical axis AX which lies along Z direction of an X-Y-Z coordinate system. Denoted at 200 is a wafer stage for holding the wafer W by attraction, and it is movable in X, Y and Z directions. The reticle R is placed on a plane which is perpendicular to the optical axis of the projection lens 201.

Denoted at 203 is a high-luminance light source such as a semiconductor laser, for example. Denoted at 204 is an illumination optical system. Denoted at 205 and 206 are deflecting mirrors, and denoted at 207 is a focus position detecting optical system. Denoted at 208 is a two-dimensional position detecting device such as a CCD, for example, and denoted at 209 is a focus control circuit. The elements 203-209 are components of focus position controlling means.

Now, the operation of the focus position controlling means will be explained. Light from the light source 203 passes a pinhole of the illumination optical system, and it is deflected by the mirror 205. Then, the light impinges on the wafer W surface with a small angle. Light reflected by a measurement point on the wafer W is deflected by the mirror 206, and after passing the focus position detecting optical system 207, the light is received by the two-dimensional position detecting device 208. The position detecting device 208 serves to detect the position of incidence of light upon its light receiving surface.

Any change in position of the wafer W in the Z direction is detected as displacement of light incidence position upon the position detecting device 208. Thus, on the basis of an output signal of the position detecting device 208, the focus controlling circuit 209 controls the position of the wafer stage in the Z direction.

Next, the exposure amount controlling means will be explained. Denoted at 213 is a sensor for detecting illuminance. Denoted at 210 is an integrated exposure amount controlling circuit which serves to integrate the illuminance signal from the sensor 213 when the shutter 214 is held open, to control the exposure. The shutter 214, a half mirror 212, the sensor 213 and the integrated exposure amount controlling circuit 210 are components of the exposure controlling means.

The operation of the exposure controlling means will now be explained. When the shutter 214 is opened, light from the light source 215 irradiates the reticle R, such that the circuit pattern, for example, of the reticle R is projected and printed on the wafer W through the projection lens 201. Simultaneously, exposure light partially divided by the half mirror 212 impinges on the sensor 213 whereby the illuminance of the exposure amount is measured. The exposure amount is integrated with time by the integrated exposure amount controlling circuit 210. When the exposure amount reaches a predetermined amount, the shutter 214 is closed to stop the exposure.

Figure 3:
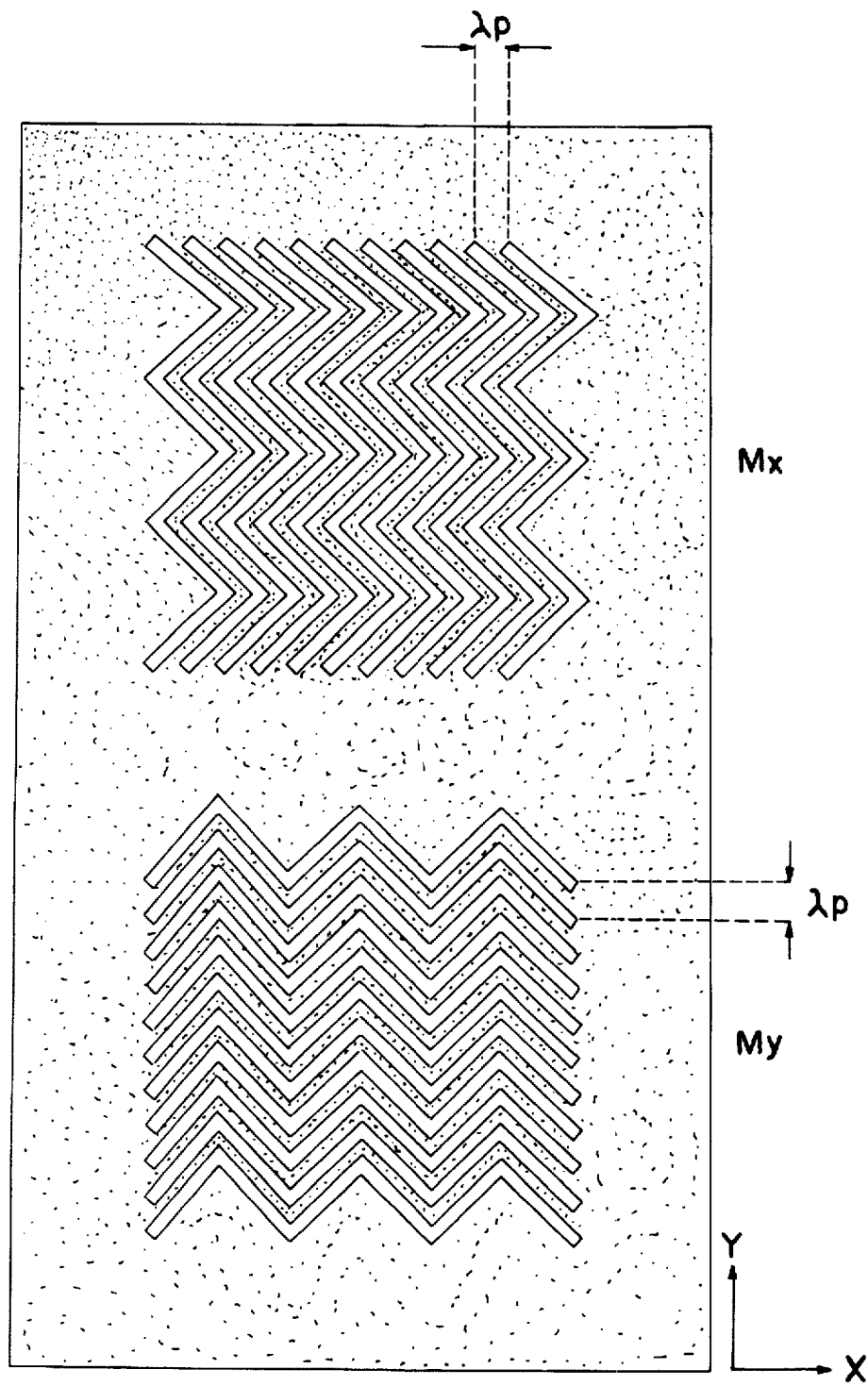
FIG. 3 is an enlarged view of a measurement pattern.

Now, trial printing process will be explained. First, a reticle $R_T$ for trial printing is loaded into the exposure apparatus of FIG. 1. The trial printing reticle $R_T$ has formed thereon a measurement pattern M such as shown in FIG. 3. The measurement pattern M comprises a non-transparent chromium film in which there are formed a plurality of zigzag openings of a constant line width, extending in a direction perpendicular to one direction (X direction or Y direction, i.e., measurement direction) and being arrayed with a constant periodicity $\lambda p$ along the measurement direction. The pattern may be considered as being provided by a plurality of triangular patterns arrayed periodically in one direction each having repetitions of a unit pattern of triangular shape arrayed in one-dimensional direction. Denoted in FIG. 3 at $M_X$ is a pattern for determination of focus and exposure condition with respect to the measurement direction X, and denoted at $M_Y$ is a pattern for determination of focus and exposure condition with respect to the measurement direction Y.

Figure 4:
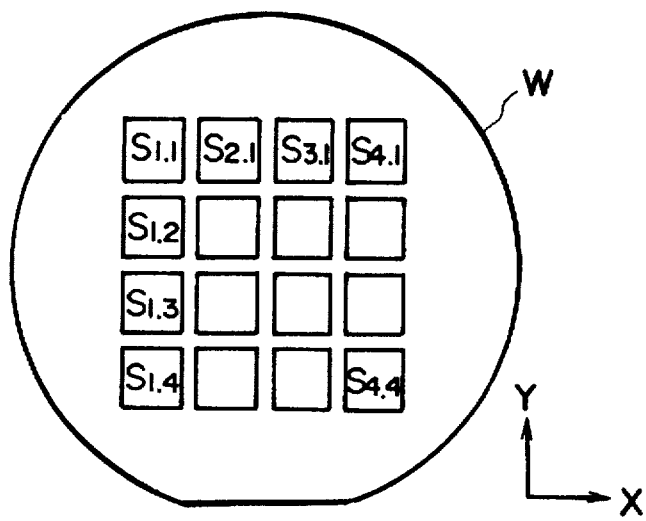
FIG. 4 is a schematic view for explaining a wafer having been processed by trial printing.

Subsequently, a wafer W having a positive type resist applied thereto is loaded on the wafer stage 200, and the reticle $R_T$ is sequentially printed (transferred) onto the wafer W in step-and-repeat procedure as illustrated in FIG. 4, whereby printed patterns M' (images of the measurement pattern M) are formed thereon.

Here, by using the focus position controlling means and the exposure controlling means, with regard to shots $S_{1,i}$ to $S_{m,i}$ in the X direction the exposure is executed while sequentially changing the exposure amount for these shots, whereas with regard to shots $S_{i,1}$ to $S_{i,n}$ in the Y direction the exposure is executed while sequentially changing the focus position for these shots by a constant amount (i.e., by sequentially changing the position of the wafer W in the optical axis direction). When shots of a predetermined number are exposed, the trial printing is completed. Thus, this process is to transfer the reticle $R_T$ pattern onto the photosensitive substrate, with different focus positions and different exposure amounts, to thereby form plural printed patterns.

(2) Development of Wafer W after Trial Printing

Figure 5A:
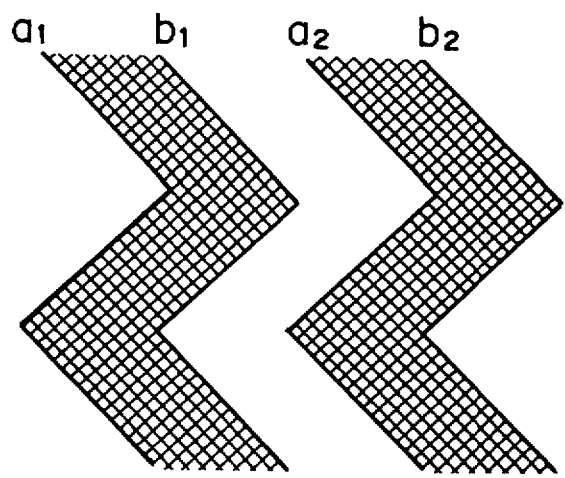
Figure 5B:
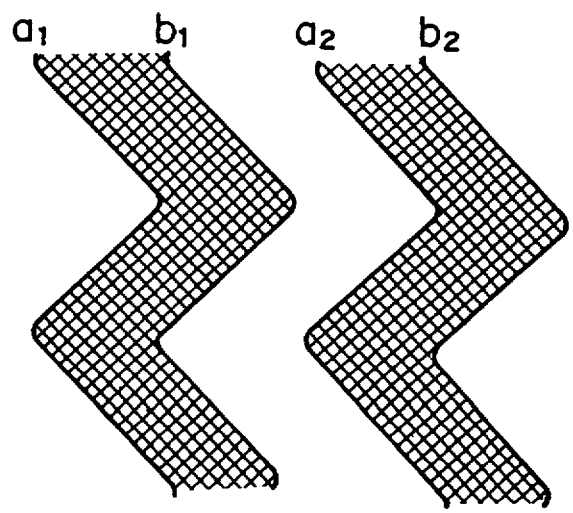

After the trial printing, the wafer W is developed (the wafer having been treated by the development process is denoted by W'). FIGS. 5A and 5B are fragmentary and enlarged views showing a resist pattern (printed pattern) M' of the developed wafer W'. Of these drawings, FIG. 5A illustrates a portion of a resist pattern M' in a shot placed at the best focus position. FIG. 5B illustrates a portion of a resist pattern M' in a shot placed out of best focus, that is, at a defocus position. At the best focus position, the resist pattern M' is formed with corners having a normal angle, whereas at the defocus position it is formed with rounded corners.

The portion between edges $a_n$ and $b_n$ represents the top (line) of the mark step, and the portion between edges $b_n$ and $a_{n+1}$ represents the groove (space) of the mark step. Although the exposure condition is not specified in the drawing, in FIGS. 5A and 5B, the ratio of width $a_1-b_1$ to width $b_1-a_2$ is 1:1, and it is suggested that the shot has been processed by optimum exposure.

(3) Determination of Best Focus and Optimum Exposure Amount

Figure 6:
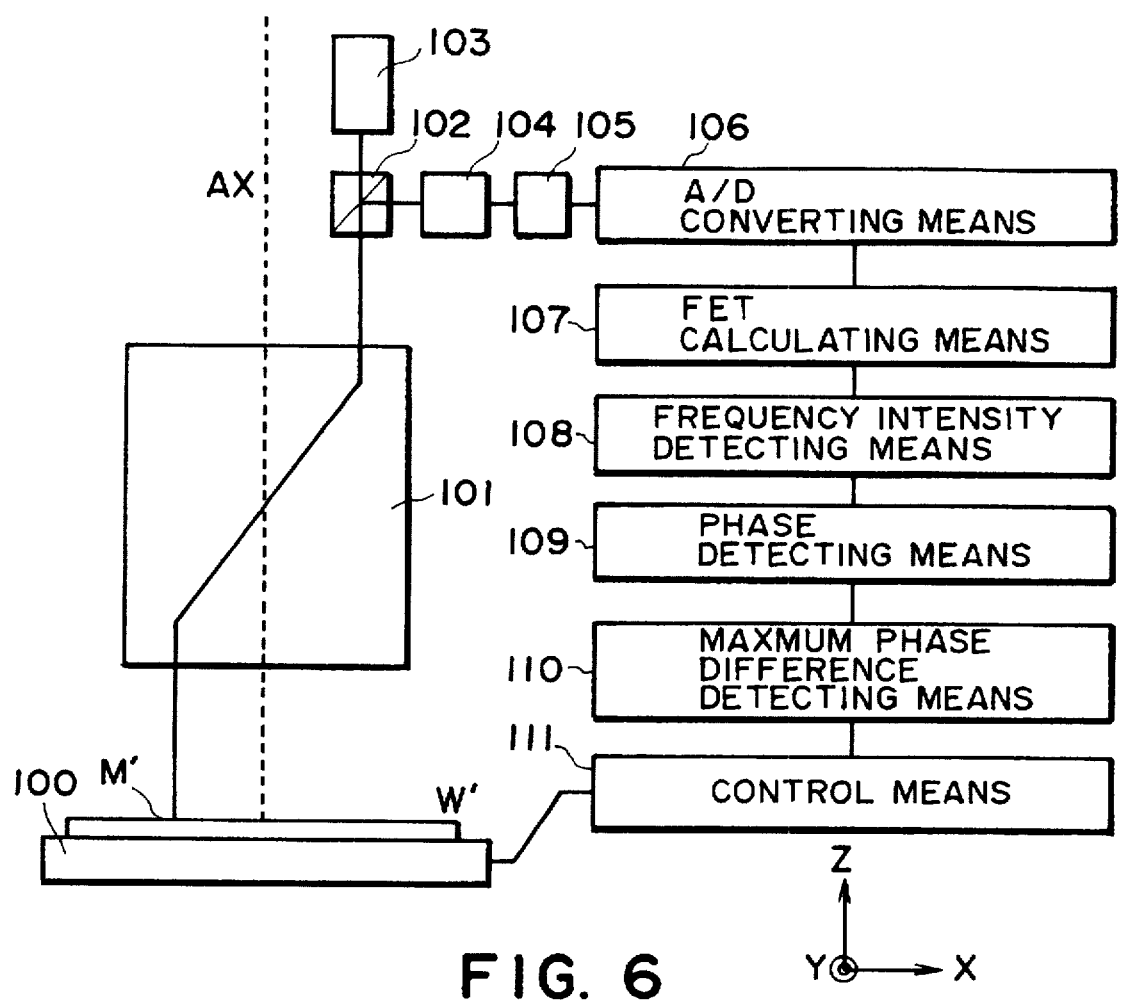
FIG. 6 is a schematic and diagrammatic view of a main portion of a resist pattern measuring system according to the present invention.

A resist pattern measuring system is used in this step. FIG. 6 is a schematic view of a main portion of such resist pattern measuring system. Denoted in the drawing at W' is a wafer having been developed. It has a resist pattern M' formed thereon. Denoted at 101 is an enlargement lens which serves to image the resist pattern M' of the wafer W'. It has an optical axis AX along a Z direction of an X-Y-Z coordinate system. Denoted at 100 is a wafer stage for holding the wafer W' by attraction, and it is movable in X, Y and Z directions.

Denoted at 103 is a partial illumination system for illuminating a resist pattern M' on the wafer W'. Denoted at 102 is a beam splitter for reflecting, laterally, reflection light from the resist pattern M' of the wafer W'. Denoted at 104 is a detection optical system cooperable with the enlargement lens 101 to provide an enlargement optical system for imaging the resist pattern M' upon an image pickup surface of a two-dimensional photoelectrically converting means 105, at a predetermined magnification. The photoelectrically converting means 105 may comprise an ITV or two-dimensional sensor, for example, and it serves to convert a received image into an electric signal.

Denoted at 106 is an analog-to-digital (A/D) converting means for converting a signal from the photoelectrically converting means 105 into two-dimensional discrete electric signal trains corresponding to the addresses in X-Y direction of picture elements on the two-dimensional image pickup surface, with a sampling pitch $\lambda s$ determined by the picture element pitch of the image pickup surface of the photoelectrically converting means 105 as well as the imaging magnification of the enlargement optical system.

Denoted at 107 is a TFT computing means which performs discrete Fourier transformation to received electric signal train Sy(x), into spatial frequency region, and which calculates its Fourier coefficient quickly.

Denoted at 109 is phase detecting means for calculating the phase θ related to a reference point $X_s$ of a spatial frequency component corresponding to the period λp of the measurement pattern M. Denoted at 110 is a maximum phase difference detecting means for determining maximum and minimum values of the phase to detect a largest phase difference. Denoted at 111 is control means for controlling the system as a whole, for determining the best focus position and for determining the correct exposure amount.

While in the foregoing description the resist pattern measuring system has been explained as being separate from the exposure apparatus, the components 102–111 described above may be incorporated into the exposure apparatus of FIG. 1. If the resist pattern measuring system is separate as above, the effect of aberration of the projection lens 201 may become smaller, such that higher precision measurement will be attainable.

In operation, the wafer W' having been developed is loaded on the wafer stage 100 as shown in FIG. 6, and the illumination system 103 is actuated to illuminate a resist pattern (printed pattern) M' on the wafer W' through the enlargement lens 101. Light from the illuminated resist pattern M' goes back through the enlargement lens 101, and, by way of the beam splitter 102 and the detection optical system 104, it is imaged on the image pickup surface of the photoelectrically converting means 105. Thus, an image of the resist pattern M' of the wafer W' is formed on the image pickup surface of the photoelectrically converting means 105, with a predetermined magnification. This procedure is to image the printed pattern M' on the image pickup surface of the photoelectrically converting means 105.

Figure 7:
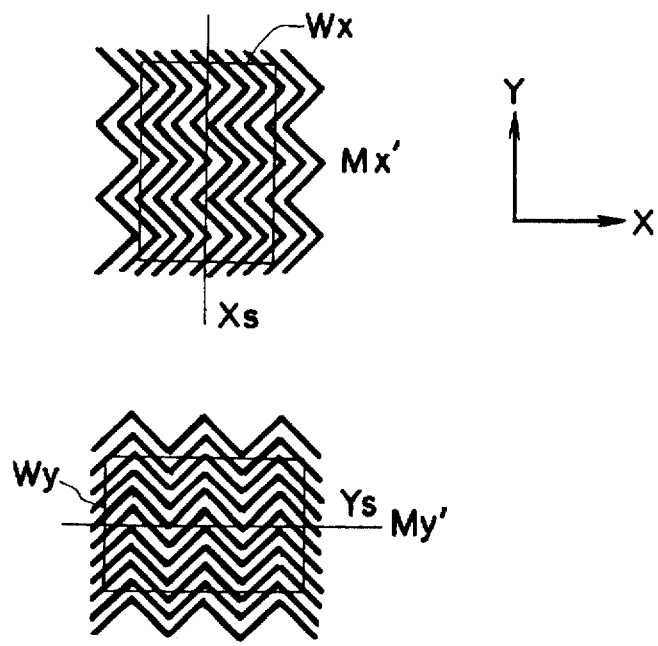
FIG. 7 is a schematic view for explaining positional relation between a resist pattern on a wafer and a window which represents a measurement region of the resist pattern measuring system.
Figure 8A:
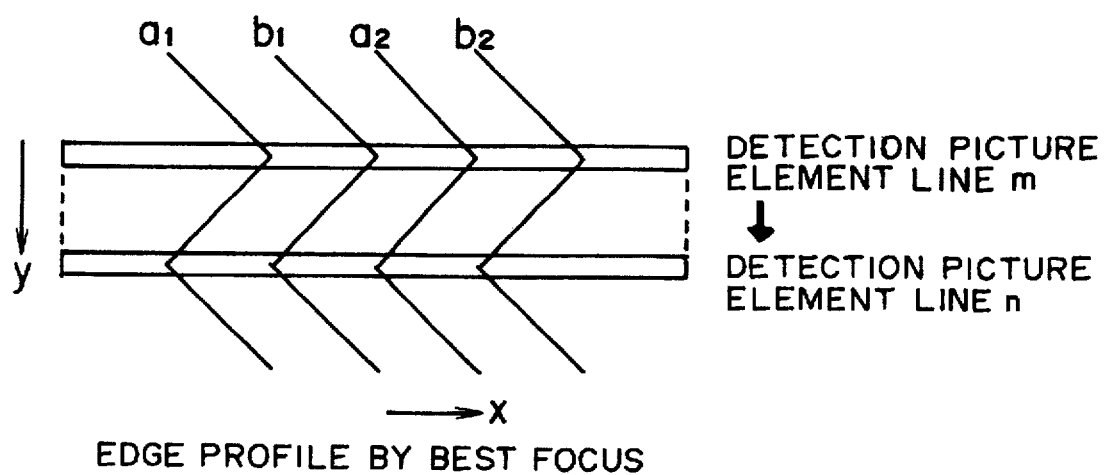
Figure 8B:
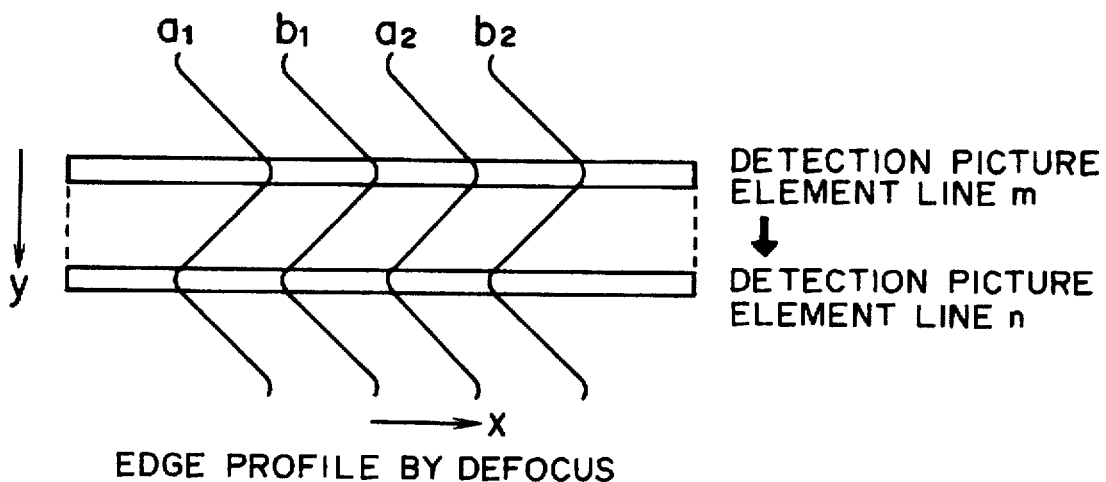

FIG. 7 is a schematic view for explaining positional relation of patterns $M_x'$ and $M_y'$ constituting the resist pattern M' and windows Wx and Wy which are measurement regions therefor. FIGS. 8A and 8B are enlarged views of a portion of the resist pattern $M_x'$ imaged on the image pickup surface of the photoelectrically converting means 105. The X and Y directions of the picture elements of the image pickup surface correspond to the measurement directions for the resist pattern M'.

Figure 9:
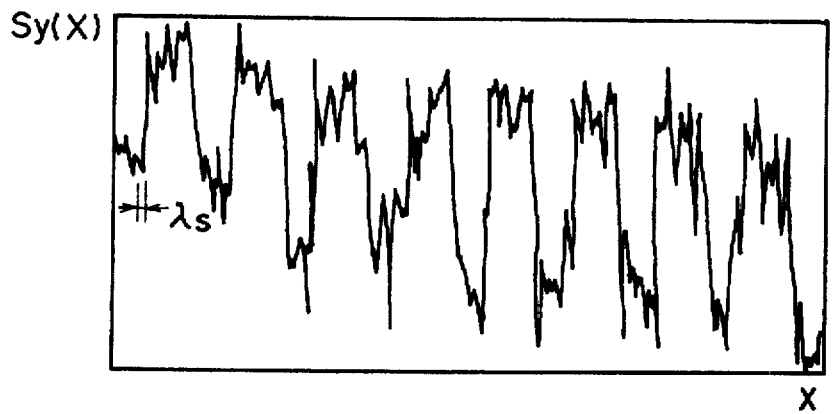
FIG. 9 is a graph showing an example of one-dimensional electric signal trains sequentially produced, in time series, from photoelectrically converting means.

The resist pattern $M_x'$ or $M_y'$ is photoelectrically converted by the converting means 105, and imagewise signals of electric signal trains are sequentially outputted. The signal is then converted by the A/D converting means 106 into a two-dimensional discrete electric signal train (X,Y) corresponding to the X-Y address of the picture elements of the two-dimensional image pickup surface, as shown in FIG. 9, with the sampling pitch λs determined by the picture element pitch of the image pickup surface as well as the imaging magnification of the enlargement optical system. FIG. 9 illustrates an example of such signal from one detection line (picture element line).

When two-dimensional discrete electric signal train is denoted by (X,Y), from the A/D converting means 106, electric signal trains being discrete in X direction are sequentially outputted to the FFT computing means 107. The electric signal trains are produced in unit of a single train in the measurement direction of the image pickup surface, this being defined as one-dimensional electric signal train Sy(x). The procedure described above is to sequentially producing, by the photoelectrically converting means, one-dimensional electric signal trains along the measurement direction.

The FFT computing means 107 performs discrete Fourier transformation to the one-dimensional electric signal train Sy(x) applied thereto, into spatial frequency region, the it calculates the Fourier coefficient quickly. The procedure is made by a known process of fast Fourier transformation (FFT) of N point (N=$2^r$). When sampling frequency fs is standardized to 1, the complex Fourier coefficient X(k) of the spatial frequency f(k)≡k/N is represented by:

$$Xy(k) = \sum_{n=0}^{N-1} Sy(x) \cdot \exp\{-j \cdot 2 \cdot \pi \cdot (k/N) \cdot n\} \quad (1)$$

The frequency intensity E(k) thereof is given by:

$$Ey(k)=[Re\{Xy(k)\}^2+Im\{Xy(k)^2\}]^{1/2} \quad (2)$$

Also, its phase is represented by:

$$\theta y(k)=\tan^{-1}[Im\{Xy(k)\}/Re\{Xy(k)\}] \quad (3)$$

where j is imaginary unit and Re{X(k)} and Im{X(k)} are real and imaginary portions of the complex X(k).

In accordance with equation (3), the phase detecting means 109 calculates the phase θ(k) related to the reference point Xs of the spatial frequency component corresponding to the period λp of the measurement pattern M. This procedure is to perform Fourier transformation to one-dimensional electric signal train to calculate the phase of the spatial frequency component corresponding to the period of the pattern.

Figure 10:
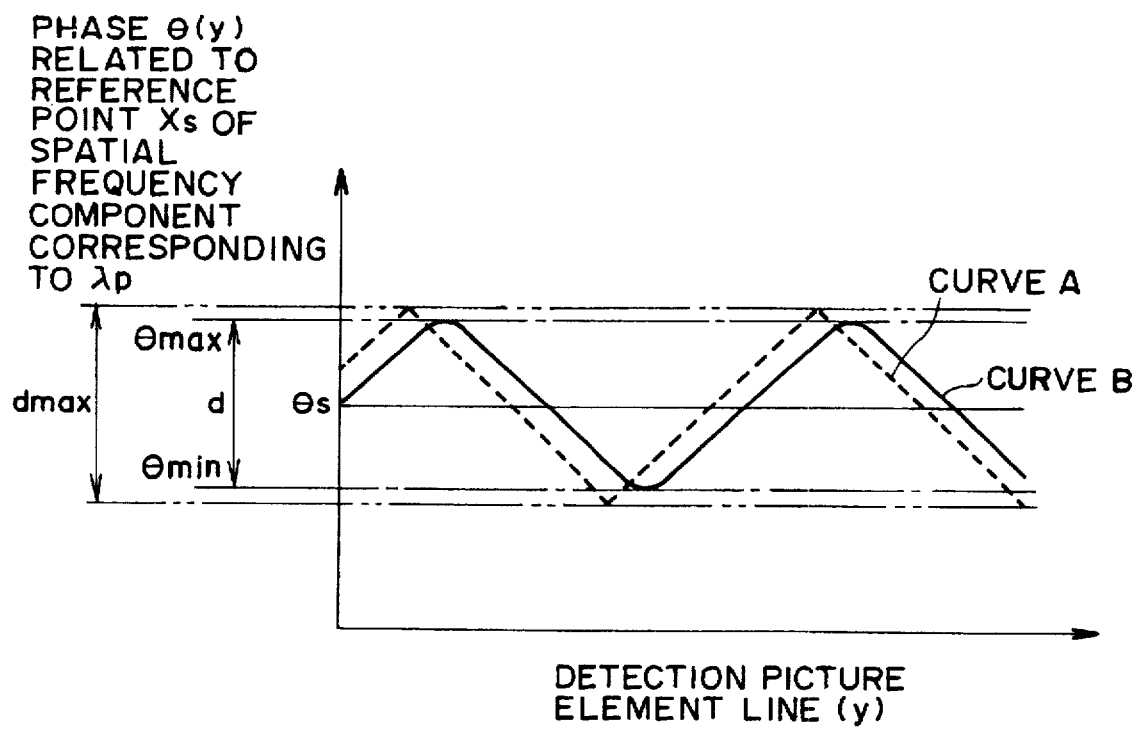
FIG. 10 is a graph wherein phases related to basic frequency components produced through Fourier transformation made to detection picture element lines, are plotted with respect to the detection picture element line.

At this stage, when plotting is made while taking the detection picture element line y on the axis of abscissa and taking the phase θ(y) on the axis of ordinate, then a curve B such as shown in FIG. 10 is produced. This curve B corresponds to one zigzag line (e.g., curve a1 or b1 in FIG. 5), constituting the outline of the image of one zigzag opening of the resist pattern M'.

Subsequently, the maximum phase difference detecting means 110 detects a maximum level $\theta(y)_{max}$ and a minimum level $\theta(y)_{min}$ of the phase, and then it determines the largest phase difference d of that zigzag line in accordance with an equation:

$$d=\theta(y)_{max}-\theta(y)_{min}$$

The maximum phase difference detecting means 110 performs the step of detecting a maximum and a minimum of the phase. The procedure of determining a largest phase difference d from the imagewise signal produced by the photoelectrically converting means is a process for calculating information (largest phase difference d) related to one of the zigzag lines constituting the outline of one of the zigzag openings.

As described, when the measurement pattern M is printed on the wafer W, in defocus state the corners are rounded such as shown in FIG. 5B. From such printed pattern, a curve B shown in FIG. 10 will be produced. Since however during the trial printing a plurality of resist patterns M' are printed while successively shifting the focus under the same exposure condition, the resultant resist patterns may include one having been printed with a best focus. From the resist pattern printed with a best focus, a curve similar to the curve A in FIG. 10 will be produced, and the largest phase difference d thereof may have a maximum level $d_{max}$.

In consideration thereof, largest phase differences d of respective shots having been calculated by the maximum phase difference detecting means 110 are memorized into the control means 111. After largest phase difference d detection for all the shots is completed, the control means 111 determines the shot whose largest phase difference d shows a maximum $d_{max}$, such that the position of the wafer W in the Z direction at which that shot has been exposed is taken as the best focus position. This procedure is the process of determining the best focus position on the basis of a maximum phase difference d of the shots.

There is a shift of phase between curve A and curve B. However, this is because the positional relation between the window Wx and the resist pattern $M_X$ is not always constant among different resist patterns M'. It does not affect the detection of maximum phase difference d, provided that the region of the window Wx is included in the region of the resist pattern $M_{X'}$.

Figure 11:
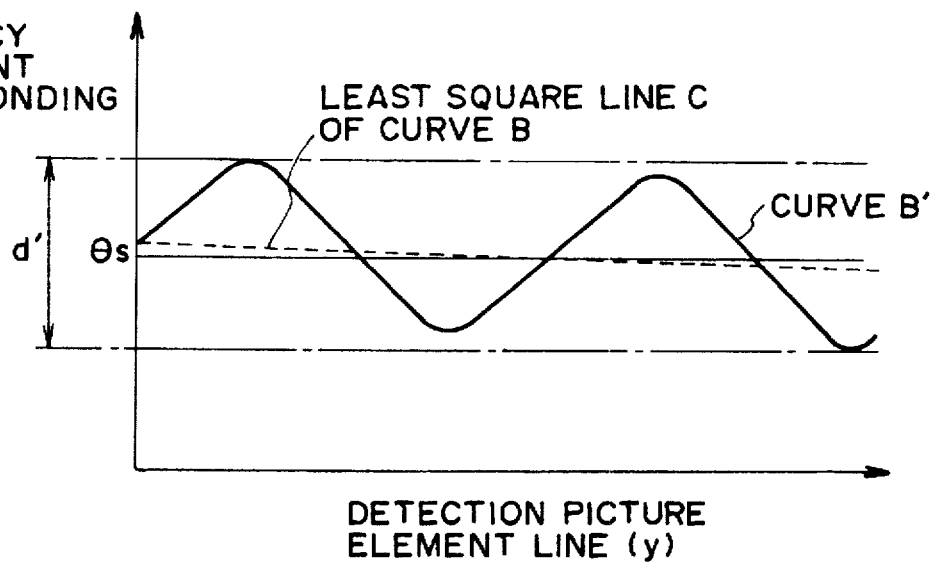
FIG. 11 is a graph for explaining a phenomenon in the process of detection of a maximum phase difference in a case where the resist pattern detecting window is relatively inclined, as well as how to meet the phenomenon.

When the window Wx and the resist pattern $M_{X'}$ are inclined by θ, as shown in FIG. 11 the curve B changes into a curve B' which is rotated by θ'=k·θ in the coordinate system. As a result, the maximum phase difference d is expanded into d' as illustrated. In that occasion, if a least square straight line C of the curve B itself is calculated within the coordinate system, then the inclination of the straight line C represents the effect of θ. Thus, a difference between the curve B and the straight line C is taken and, by detecting its maximum phase difference, the maximum phase difference d can be calculated accurately while excluding the effect of θ.

Advantageous results of this embodiment will be explained. In best focus determination, in the point of S/N it is practically difficult to recognize rounding of one corner as a positional change of the edge, through image processing. However, by performing FFT computation with a pattern having plural corners and by detecting the phase θ(k) of the spatial component corresponding to the period λp of the measurement pattern M as in the present embodiment, small deformation of a corner can be detected precisely.

Further, in X-direction measurement, for example, only with a corner being oriented right, it is not possible to discriminate it from lateral shift of the resist pattern M' relative to the window. However, by preparing a resist pattern M having a corner being oriented left and by taking a difference between the left and right corners, detection of only the sharpness of a corner is enabled, independently of the position of the resist pattern M'.

The present invention may be considered such that the best focus position is determined on the basis of imagewise information of a printed pattern of the wafer W in the measurement direction.

Also, the best focus determination does not need measurement of the line width of resist pattern M7 by using an expensive scanning electron microscope, and the best focus can be determined in a short time automatically.

In the present embodiment, for best focus determination, the width (spacing) between left and right corners in the measurement direction is transformed into a phase, as obtainable by FFT computation to one-dimensional electric signal train, representing light intensity distribution, and the best focus is determined on the basis of its maximum phase difference. However, the best focus may be determined by using any other method for detecting a particular characteristic point through image processing. For example, a template matched to the image of a corner portion may be prepared to detect the corner position. In that occasion, the FFT computing means 107, the frequency intensity detecting means 108 and the phase detecting means 109 of FIG. 6 may be replaced by a corner position detecting means, and the maximum phase difference detecting means 110 may be replaced by maximum inter-corner distance detecting means.

Next, the manner of determining the optimum exposure amount will be explained. When the measurement pattern M shown in FIG. 3 is printed while changing the exposure amount, what changes significantly in the resist pattern M' is the duty (the proportion of line and space) of the resist pattern M'. Namely, when considered with reference to FIG. 5, the ratio of the distance between $a_n$ and $b_n$ to the distance between $b_n$ and $a_{n+1}$ changes.

A change in duty of the resist pattern M' appears as a change in frequency intensity when the resist pattern M' is Fourier transformed. Thus, the optimum exposure amount is determined in consideration of a change in intensity of a particular frequency as resist patterns M', having been printed at the best focus position while changing the exposure amount, is Fourier transformed by FFT.

The procedure of determination of optimum exposure amount will now be explained. Similarly to best focus determination, a wafer W' is loaded into the resist pattern measuring system. Then, in this case, the resist patterns M' of those shots having been printed at the best focus, determined beforehand, and with different exposure amounts, are placed at the detecting position, and an image of the resist pattern M' is applied to the photoelectrically converting means 105. Imagewise signal from the converting means 105 is converted by the A/D converting means 106 into electric signal trains Sy(x) which are applied to the FFT computing means. In the FFT computing means, FFT calculation is performed, whereby intensity distributions E(k) of respective frequency components are calculated.

Figure 12:
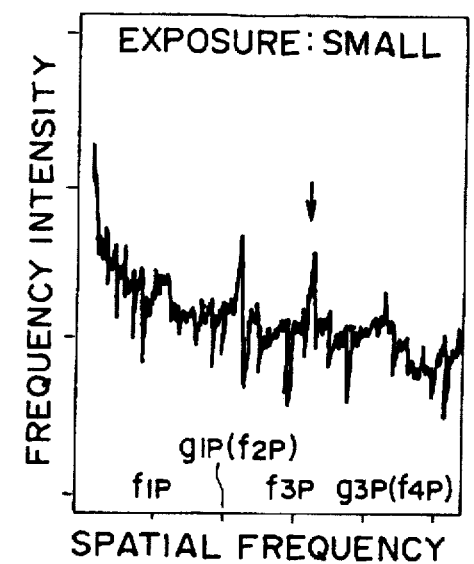
FIG. 12 is a graph of an example of spatial frequency intensity distribution produced by Fourier transformation of a resist pattern in a case where the exposure amount is insufficient.
Figure 13:
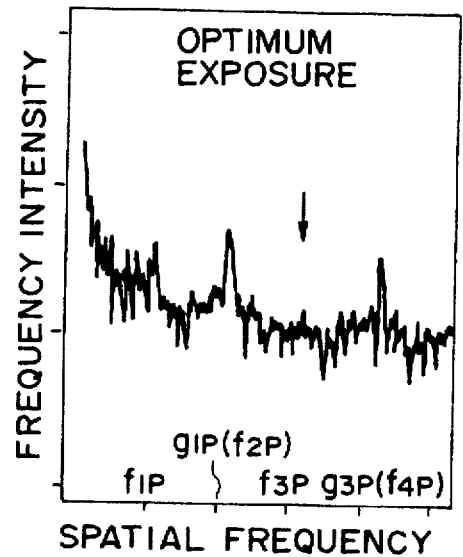
FIG. 13 is a graph of an example of spatial frequency intensity distribution produced by Fourier transformation of a resist pattern in a case where the exposure amount is correct.
Figure 14:
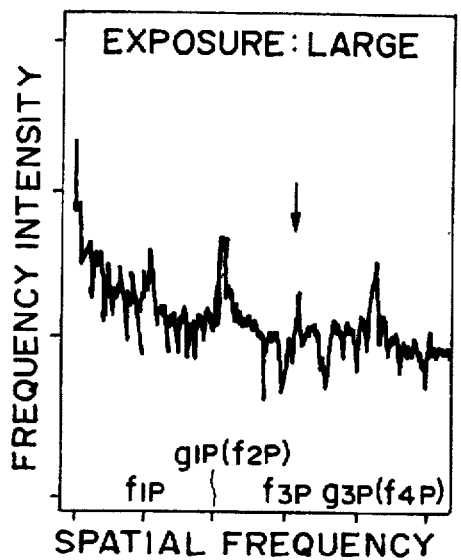
FIG. 14 is a graph of an example of spatial frequency intensity distribution produced by Fourier transformation of a resist pattern in a case where the exposure amount is excessive.

FIGS. 12–14 illustrate intensity distributions E(k) corresponding to spatial frequencies. FIG. 12 corresponds to a case where the exposure amount is insufficient. FIG. 13 corresponds to a case of optimum exposure amount. FIG. 14 corresponds to a case where the exposure amount is excessive. In these drawings, there is a relation fnp=n·$\lambda_s$/$\lambda_p$.

Figure 15:
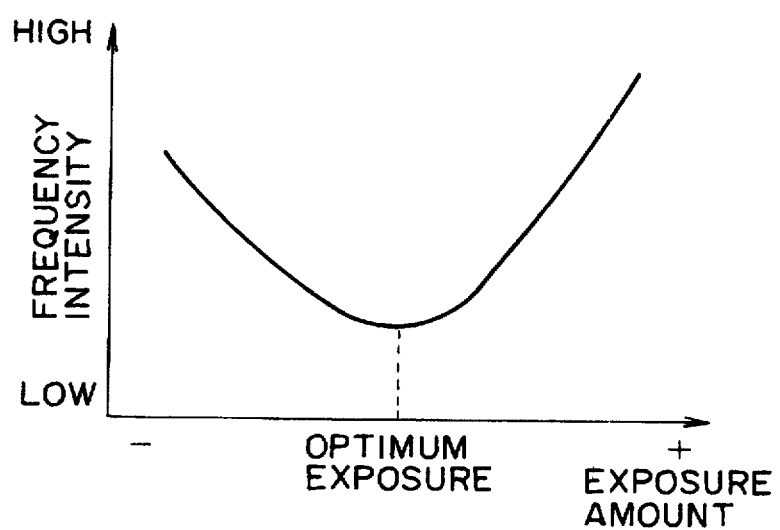
FIG. 15 is a graph for explaining the relation between exposure amount and frequency intensity, in relation to a particular frequency.

Paying attention to a particular frequency component among them, changes in intensity of the particular frequency component when the pattern is printed with optimum exposure amount (in many cases, when the duty is 1:1) are measured beforehand. For example, FIG. 15 illustrates the relation between the exposure amount and the intensity of a spatial frequency f3p in a case where attention is paid to that spatial frequency f3p. It is now assumed that this drawing suggest that, in optimum exposure, the intensity of the spatial frequency f3p shows a minimum level.

Thus, with regard to the shots of the wafer W' having been printed at the best focus position and with different exposure amounts, the intensity of the spatial frequency f3p is detected, and the exposure amount of such shot in which the frequency intensity is lowest is taken as the optimum exposure amount.

The frequency intensity depends also on differences in illumination light quantity between shots or differences in reflection light quantity due to a difference in resist thickness. If a measurement error due to such factor is predicted, then such exposure amount with which the ratio of intensity to any other spatial frequency, for example, a spatial frequency g1p or g2p, may be determined as an optimum exposure amount, by which stable exposure condition measurement may be assured.

With the procedure described above, the best focus position and optimum exposure amount, namely, the optimum exposure condition, of the exposure apparatus are determined.

Although, in the optimum exposure amount determination described above, the optimum exposure amount is determined after determination of the best focus position and through Fourier transformation to such shots having been printed at the best focus position and with different exposure amounts, it may be done as follows. That is, with regard to each shot $S_{i,j}$ of a wafer W' processed by trial printing, a largest phase difference $d_{i,j}$ and intensity $E_{i,j}$ of a particular spatial frequency component are detected automatically and memorized into the control means 111. After these values are detected with respect to all the shots, the control means 111 determines the shot that shows a maximum $d_{max}$ and determines the best focus position. Subsequently, from the data memorized, the intensities $E_{i,j}$ of the particular spatial frequency component of the shots, having been printed at the best focus position with different exposure amounts are checked, and the shot corresponding to the optimum exposure amount is determined. The corresponding data is outputted. In this manner, optimum exposure condition can be determined promptly.

Determination of exposure condition through Fourier transformation, in the manner described above, enables automatic and high-precision determination of the best focus and optimum exposure amount, namely, optimum exposure condition, in a short time and without using an expensive scanning electron microscope.

The determined best focus value may be fed back to the focus control means of the exposure apparatus, and the determined optimum exposure amount may be fed back to the integrated exposure amount controlling means of the exposure apparatus, by which the exposure process is performed with optimum exposure amount while a wafer W is placed at the best focus position.

The above-described procedure may be repeated in accordance with the type of a resist used or a change in thickness thereof. This facilitates determination of best focus position and optimum exposure amount, that is, optimum exposure condition, constantly.

While in the present embodiment a wafer W having been processed by trial printing is developed and a resist pattern M' of the developed wafer W' is measured, the best focus and optimum exposure amount can be determined on the basis of detection of a latent image formed in the resist layer, prior to the development process. Detecting a latent image omits the necessity of development process for a trial-printed wafer. Thus, optimum exposure condition can be determined automatically without unloading the wafer W from the exposure apparatus. This significantly reduces the setting-up time.

Now, a method of measuring aberration of a projection lens 201 on the basis of best focus determination, will be explained. Since the measurement pattern M shown in FIG. 3 comprises elements arrayed in the X and Y directions, respectively, at one and the same position upon the wafer W, the best focus position with respect to both the X and Y directions can be detected. On the basis of this detection, astigmatism of the projection lens 201, in the image plane and at that portion, can be measured.

When plural measurement patterns M are provided at different locations at the center of the exposure region and in the peripheral portion, tilt of image plane and curvature of image field of the projection lens 201 with intervention of resist process can be detected. For higher precision and for FFT processing, the number of line-and-space marks of the measurement pattern M should desirably be large, and at least ten will be necessary.

For detection of aberration of the projection lens 201 as described above, it is not necessary to use, as the photosensitive material, a resist material which is to be used practically. For example, a photosensitive material such as a mangetooptic material or photochromic material, may be used.

Further, while in the present embodiment exposure condition for an exposure apparatus which uses a projection lens is determined, the present invention is applicable also to determining exposure condition for an exposure apparatus of proximity exposure type that does not use a projection lens. In that occasion, in place of changing the focal point position, trial printing may be done while changing the spacing between a mask having a pattern and a wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of determining a best focus position of a projection lens in an arrangement wherein a reticle is placed on a plane perpendicular to an optical axis of the projection lens, wherein a pattern having periodicity in a predetermined direction is provided on a surface of the reticle, wherein the pattern is transferred to a photosensitive substrate by the projection lens to form a printed pattern thereon, wherein the pattern formation is repeated with different focus positions, and wherein the best focus position of the projection lens is determined on the basis of different printed patterns transferred to the photosensitive substrate, said method comprising the steps of:

providing the pattern by using a plurality of zigzag openings of a constant line width, extending in a direction perpendicular to the predetermined direction and being arrayed with a constant periodicity along that direction;

transferring the pattern to the photosensitive substrate sequentially with different focus positions to form plural printed patterns thereon;

imaging the printed patterns upon an image pickup surface of photoelectrically converting means;

calculating, from an imagewise signal produced by the photoelectrically converting means, information related to one frequency component of zigzag lines, constituting an outline of an image of the zigzag opening; and determining the best focus position on the basis of the information.

2. A method according to claim 1, wherein said calculation of the information related to the one frequency component of the zigzag line comprises (i) sequentially producing one-dimensional electric signal trains along the direction by using the photoelectrically converting means, (ii) executing Fourier transformation to the one-dimensional electric signal trains to calculate a phase of a spatial frequency component corresponding to the periodicity of the pattern, and (iii) detecting a maximum value and a minimum value of the phase.

3. A method according to claim 1, wherein the photosensitive substrate comprises a wafer having a resist coating.

4. A method according to claim 1, wherein the printed pattern comprises a resist pattern defined after a development process.

5. A method according to claim 1, wherein the printed pattern comprises a latent image formed in a resist layer before a development process.

6. A method of determining a best focus position of a projection lens in an arrangement wherein a reticle is placed on a plane perpendicular to an optical axis of the projection lens, wherein a pattern having periodicity in a predetermined direction is provided on a surface of the reticle, wherein the pattern is transferred to a photosensitive substrate by the projection lens to form a printed pattern thereon, wherein the pattern formation is repeated with different focus positions, and wherein the best focus position of the projection lens is determined on the basis of different printed patterns transferred to the photosensitive substrate, said method comprising the steps of:

provid ing the pattern by using a plurality of zigzag openings of a constant line width, extending in a direction perpendicular to the predetermined direction and being arrayed with a constant periodicity along that direction;

imaging the printed patterns upon an image pickup surface of photoelectrically converting means;

calculating, from an imagewise signal produced by the photoelectrically converting means, information related to one frequency component of zigzag lines, constituting an outline of an image of the zigzag opening; and determining the best focus position on the basis of the information.

7. A method of determining a best exposure amount, comprising the steps of:

placing a reticle on a plane perpendicular to an optical axis of a projection lens;

providing, on a surface of the reticle, a pattern having zigzag openings of a constant line width, extending in a direction perpendicular to a predetermined direction and being arrayed with a constant periodicity along that direction;

sequentially transferring the pattern to a photosensitive substrate with different focus positions of the projection lens and with different exposure amounts to form printed patterns thereon;

imaging the printed patterns upon an image pickup surface of photoelectrically converting means;

sequentially providing, through the photoelectrically converting means, one-dimensional electric signal trains along the direction;

executing Fourier transformation to the one-dimensional electric signal trains to calculate phase information and intensity information of a spatial frequency component;

determining the best focus position of the projection lens on the basis of the phase information of the spatial frequency component corresponding to the periodicity of the pattern; and determining the best exposure amount on the basis of a characteristic of a spatial frequency component produced by Fourier transformation of printed patterns formed at the determined best focus position and with different exposure amounts.

8. A method of determining a best focus position of a projection lens, comprising the steps of:

providing on a reticle a pattern having a plurality of triangular patterns arrayed periodically in one direction and including repetitions of a unit pattern of triangular shape in a one-dimensional direction;

projecting, through a projection lens, the pattern of the reticle onto a photosensitive substrate while sequentially changing a position of the photosensitive substrate in an optical axis direction; and determining the best focus position of the projection lens on the basis of imagewise information of the pattern in one direction of the photosensitive substrate.

* * * * *

UNITED STATES PATENT AND TRADEMARK OFFICE
CERTIFICATE OF CORRECTION

PATENT NO. : 5,750,294

DATED : May 12, 1998

INVENTOR(S) : Masanobu HASEGAWA, et al.

It is certified that error appears in the above-identified patent and that said Letters Patent is hereby corrected as shown below:

ON THE COVER PAGE:

AT [56] References Cited: U.S. PATENT DOCUMENTS:

The following should be inserted:

```
--5,200,800   4/1993  Suda et al. ........356/401
  5,291,023   3/1994  Hasegawa et al. ....250/548
  5,313,272   5/1994  Nose et al. ........356/375
  5,333,050   7/1994  Nose et al. ........356/356
  5,369,486  11/1994  Matsumoto et al. ...356/349
  5,396,335   3/1995  Hasegawa et al. ....356/401
  5,432,603   7/1995  Sentoku et al. .....356/349
  5,461,474  10/1995  Yoshii et al. ......356/237
  5,486,919   1/1996  Tsuji et al. .......356/349
  5,495,336   2/1996  Nose et al. ........356/375--.
```

UNITED STATES PATENT AND TRADEMARK OFFICE
CERTIFICATE OF CORRECTION

PATENT NO. : 5,750,294

DATED : May 12, 1998

INVENTOR(S) : Masanobu HASEGAWA, et al.

It is certified that error appears in the above-identified patent and that said Letters Patent is hereby corrected as shown below:

COLUMN 10:

Line 47, "suggest" should read --suggests--.

Signed and Sealed this

Twentieth Day of April, 1999

Attest:

Q. TODD DICKINSON

Attesting Officer

Acting Commissioner of Patents and Trademarks